May 16, 1967 A. HOPENGARTEN ET AL 3,320,543

TRANSISTORIZED PUSH-PULL AMPLIFIER CIRCUIT UTILIZING POSITIVE FEEDBACK

Filed March 25, 1964

INVENTORS
RICHARD F. WOOD
ABRAM HOPENGARTEN

BY Robert D. Sanborn

ATTORNEY

United States Patent Office 3,320,543
Patented May 16, 1967

3,320,543

TRANSISTORIZED PUSH-PULL AMPLIFIER CIRCUIT UTILIZING POSITIVE FEEDBACK

Abram Hopengarten, Lafayette Hills, Pa., and Richard F. Wood, Marlton, N.J., assignors to Philco-Ford Corporation, a corporation of Delaware Filed Mar. 25, 1964, Ser. No. 354,635
9 Claims. (Cl. 330—15)

This invention relates to transistorized amplifier circuits and more particularly to circuits which provide a push-pull output from a single-ended input.

One type of such circuit employs a so-called split load driver transistor A.C. coupled to a push-pull output stage comprising two transistors whose emitter-collector paths are connected in series to the D.C. voltage supply source. The signal to be amplified is applied to the base of the driver transistor and the signal is derived in opposite phases from emitter and collector loads and supplied to the respective bases of the two transistors of the push-pull output stage.

One object of the present invention is to provide an improved amplifier circuit of this type.

Another and more specific object of the invention is to provide such a circuit in which the transition time of the push-pull operation is decreased, thereby enabling reduction in the normal quiescent current requirements of Class B push-pull operation and consequent reduction of cross-over distortion.

Other objects and features of the invention will become apparent as the description proceeds.

*Summary*

In accordance with this invention, a circuit of the above-mentioned type is provided in which a novel feedback arrangement hastens the transition between off and on time of one of the push-pull transistors and also insures cut-off of the same transistor. It is this decrease of transition time that enables a reduction in the normal quiescent current. The other one of the push-pull transistors is cut-off in the conventional manner.

*Drawings*

Figure 1:
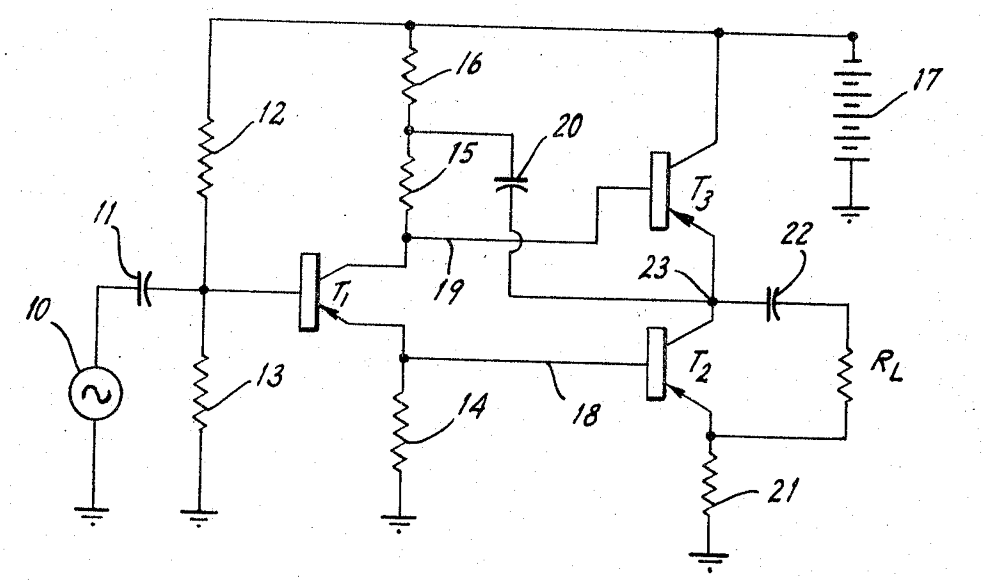
Figure 2:
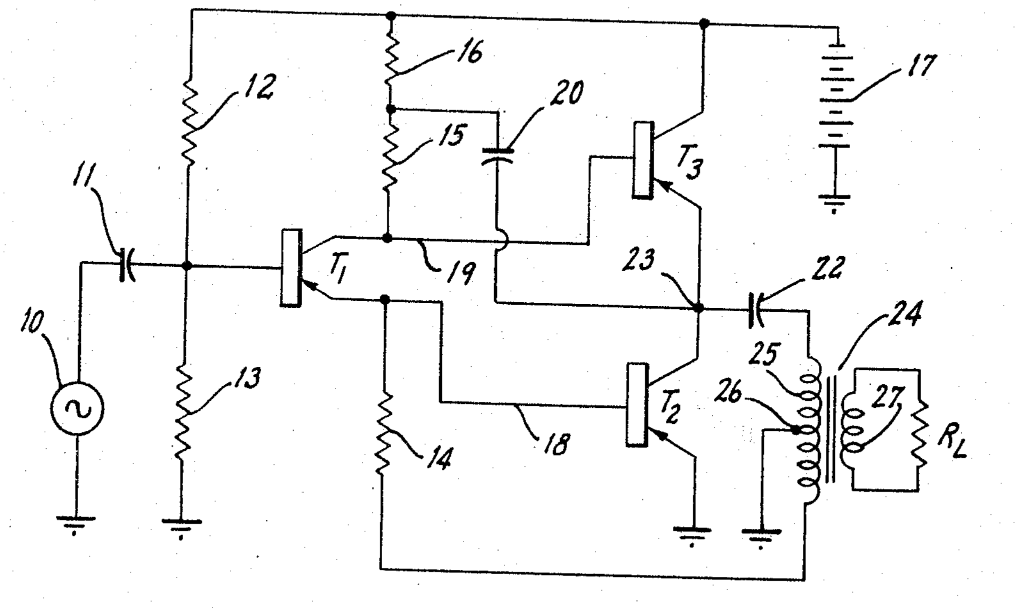

FIG. 1 is a schematic illustration of a preferred form of amplifier circuit according to the invention; and FIG. 2 is a similar illustration of an alternative form of the circuit.

*FIG. 1*

The circuit illustrated in FIG. 1 comprises a first transistor $T_1$ which is the driver and second and third transistors $T_2$ and $T_3$ which are driven in push-pull from transistor $T_1$. A signal source is represented at 10 from which the signal to be amplified is supplied to the base of transistor $T_1$ through coupling capacitor 11. Resistors 12 and 13 comprise a conventional voltage divider bias stabilizing arrangement. An emitter resistor 14 is connected between the emitter of transistor $T_1$ and ground. Series connected resistors 15 and 16 constitute a collector load impedance between the collector of transistor $T_1$ and the negative terminal of voltage supply source 17 whose positive terminal is connected to ground.

The collector-emitter paths of the second and third transistors $T_2$ and $T_3$ are serially connected between the negative terminal of source 17 and ground. The base of transistor $T_2$ is connected to the emitter of transistor $T_1$ by a direct connection 18. The base of transistor $T_3$ is connected to the collector of transistor $T_1$ by a direct connection 19. The emitter of transistor $T_3$ is coupled to the junction of resistors 15 and 16 through capacitor 20, so that the collector load resistor 15 serves additionally as a floating input source for transistor $T_3$.

An important feature of the circuit resides in the coupling arrangement of load resistor $R_L$ and the provision of resistor 21 which is connected between the emitter of transistor $T_2$ and ground. The upper end of load resistor $R_L$ is coupled through capacitor 22 to the junction point 23 of transistors $T_2$ and $T_3$, and the lower end thereof is connected to the emitter of transistor $T_2$.

In operation, the transistors $T_2$ and $T_3$ are alternately operative (i.e. in Class B push-pull operation) to amplify the signal and supply it to the load $R_L$. Resistor 21 serves as a portion of the total load of transistor $T_3$ but not of transistor $T_2$ whose entire load is resistor $R_L$. Hence current flows through resistor 21 only when transistor $T_3$ is turned on and transistor $T_2$ is turned off. Transistor $T_3$ is turned on and off in conventional manner by the voltage across resistor 15. However the turn on and turn off of transistor $T_2$ is expedited by the provision of resistor 21 and the connection of the load resistor $R_L$ as shown, as will now be explained.

When the voltage at the collector of transistor $T_1$ swings negative, the voltage at the emitter of transistor $T_1$ swings positive, and hence transistor $T_3$ is turned on and transistor $T_2$ is turned off. The current which then flows in resistor 21 will supply a positive feedback voltage to the emitter of transistor $T_2$ and which will hasten and insure the turn-off of transistor $T_2$.

When the voltage at the collector of transistor $T_1$ swings positive, the voltage at the emitter of the same transistor swings negative, and hence transistor $T_3$ is turned off and transistor $T_2$ is turned on. The cessation of current flow in resistor 21 causes the emitter of transistor $T_2$ to swing positive, thereby hastening the turn-on of transistor $T_2$. This enables a reduction in the normal quiescent current requirements of Class B push-pull operation. Resistor 21 also provides D.C. stabilization for the output stage.

The D.C. voltage at point 23 should be one-half the total D.C. supply voltage. Since the voltage drop across the base-emitter junction of transistor $T_3$ is small, the D.C. voltage at point 23 will be approximately the same as that at the collector of transistor $T_1$. With resistors 14 and 15 small in relation to resistor 16, the latter resistor and the collector current of transistor $T_1$ may be adjusted so that the D.C. voltage at point 23 is in fact one-half the total D.C. supply voltage.

The amount of positive feedback at the emitter of transistor $T_2$, which is determined by the ratio of resistors $R_L$ and 21, has a non-critical optimum value of approximately 50:1. Excessive feedback causes distortion to increase due to the speed of transition, while too little feedback requires greater quiescent current to eliminate cross-over distortion.

*FIG. 2*

Referring now to FIG. 2, the elements therein having homologues in FIG. 1 are similarly designated. The circuit of FIG. 2 is the same as that of FIG. 1 except for the feedback circuitry. In FIG. 2 the emitter of transistor $T_2$ is connected to ground, and the feedback arrangement employs an output transformer 24 whose primary winding 25 has a tap 26 connected to ground. The lower end of the primary winding 25 is connected to the emitter resistor 14 of transistor $T_1$. The load resistor $R_L$ is connected to the secondary winding 27.

In operation of the circuit of FIG. 2, when transistor $T_3$ is turned on a positive voltage is fed back to the base of transistor $T_2$ to hasten and insure turn-off of that transistor. When transistor $T_3$ is turned off, there is no feedback and transistor $T_2$ is turned on quickly by the voltage at the emitter of transistor $T_1$.

While the invention has been described with reference to the illustrated embodiments, it will be understood that the invention is not limited thereto but contemplates such modifications and further embodiments as may occur to those skilled in the art. For instance in lieu of using the voltage divider comprising resistors 12 and 13, the base bias voltage for transistor $T_1$ in either embodiment may be obtained by means of D.C. feedback connected from point 23 to the base of transistor $T_1$. This latter arrangement would provide a more stabilized base voltage for transistor $T_1$.

We claim:

1. A push-pull output circuit, comprising:
(a) a pair of transistors, the emitter-collector paths thereof being connected in series such that the emitter of one transistor is connected to the collector of the other transistor,
(b) means for supplying a direct current bias across said series-connected emitter-collector paths,
(c) means for supplying an alternating signal to said one of said transistors in a first phase and to said other of said transistors in the opposite phase so as to drive said transistors in push-pull,
(d) load means connected across said transistor so as to receive current therefrom in proportion to the amplitude of said signal,
(e) positive feedback means (1) responsive to the current change in said load means each time said one of said transistors turns on for hastening the turn-off of said other of said transistors, and (2) responsive to the current change in said load impedance each time said one of said transistors turns off for hastening the turn-on of said other of said transistors, whereby the quiescent bias current requirement of said transistors can be reduced.

2. The circuit of claim 1 wherein: said (b) means comprises a direct voltage source having two terminals; the collector of said one transistor is connected to one of said terminals; said (d) means comprises an impedance connected between the emitter and collector of said other transistor; and said (e) means comprises an impedance connected between the emitter of said other transistor and the other terminal of said source.

3. The circuit of claim 1 wherein said (c) means comprises a driver transistor having a signal source connected across the emitter and base of said driver transistor, the collector and emitter of said driver transistor being connected to the respective bases of said pair of transistors.

4. The circuit of claim 3 wherein one impedance connects the emitter of said driver transistor to one terminal of a direct voltage supply source, a second impedance connects the collector of said driver transistor to the other terminal of said supply source, and an intermediate point on said second impedance is connected to the emitter of said one transistor.

5. The circuit of claim 1 wherein said (b) means comprises a direct voltage source having two terminals, the collector of said one transistor is connected to one of said terminals, the emitter of said other transistor is connected to the other of said terminals, said (e) means comprises a transformer having a primary winding having one terminal thereof connected to the collector of said other transistor, a tap on said primary winding being connected to the other terminal of said direct voltage source, the other end of said primary winding being coupled to the base of said other transistor, and said load means comprises a load impedance connected across a secondary winding of said transformer.

6. A push-pull output circuit, comprising:
(a) a source of an alternating current signal,
(b) a source of direct current bias potential having two terminals,
(c) a pair of transistors, the collector and emitter of one of said pair connected to one terminal of said bias source and to the collector of the other transistor of said pair, respectively,
(d) means for driving said pair of transistors in push-pull fashion in response to the output of said signal source,
(e) a load impedance connected between the emitter and collector of said other transistor, and
(f) means connected between the emitter of said other transistor and the other terminal of said source for supplying a positive feedback voltage to the emitter of said other transistor, thereby to reduce the quiescent current requirement of said circuit.

7. The circuit of claim 6 wherein said (f) means comprises a resistor.

8. A push-pull output circuit, comprising:
(a) a voltage source having first and second terminals and arranged to supply a potential difference therebetween,
(b) a pair of output transistors, the collector and emitter of one being connected to one terminal of said source and to the collector of the other transistor of said pair, respectively, the emitter of said other transistor being connected to the other terminal of said source solely by a resistor,
(c) a series circuit comprising a load impedance and coupling capacitor connected between the emitter and collecter terminals of said other transistor, and
(d) means coupled to the bases of said pair of transistors for driving said transistors in push-pull fashion, whereby said resistor will provide positive feedback to said other transistor and reduce the quiescent current requirement of said circuit.

9. The circuit of claim 8 wherein said (d) means comprises a driver transistor having an emitter connected to one terminal of said source via a resistor and to the base of said other transistor, and a collector connected to the base of said one transistor and to the other terminal of said source via two series-connected impedances, the junction of said impedances being capacitively-coupled to the emitter of said one transistor.

References Cited by the Examiner

UNITED STATES PATENTS

| | | | |
|---|---|---|---|
| 2,802,907 | 8/1957 | Peterson et al. | 330—81 |
| 2,929,026 | 3/1960 | Walker | 330—70 |

FOREIGN PATENTS

| | | |
|---|---|---|
| 213,957 | 3/1961 | Austria. |

OTHER REFERENCES

Aronson et al.: "Transistor Audio Frequency Amplifier," RCA TN No. 36, rec'd in Patent Office Aug. 9, 1957, 1 sheet, 330–14.

"Output Transformerless Amplifiers," Wireless World, February 1957, pages 58–62, copy in Scientific Library or 330–70.

ROY LAKE, *Primary Examiner.*

F. D. PARIS, *Assistant Examiner.*